(12) United States Patent
Fan et al.

(10) Patent No.: US 8,193,900 B2
(45) Date of Patent: Jun. 5, 2012

(54) METHOD FOR FABRICATING METAL GATE AND POLYSILICON RESISTOR AND RELATED POLYSILICON RESISTOR STRUCTURE

(75) Inventors: Cheng-Wen Fan, Hsinchu County (TW); Kun-Szu Tseng, Pingtung County (TW); Che-Hua Hsu, Hsin-Chu Hsien (TW); Chih-Yu Tseng, Hsinchu (TW); Victor-Chiang Liang, Hsin-Chu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 430 days.

(21) Appl. No.: 12/490,334

(22) Filed: Jun. 24, 2009

(65) Prior Publication Data

US 2010/0328022 A1    Dec. 30, 2010

(51) Int. Cl.
*H01C 1/012* (2006.01)

(52) U.S. Cl. ........................................ 338/309

(58) Field of Classification Search ............ 338/309; 438/210, 152–156; 257/350, 379
See application file for complete search history.

(56) References Cited

U.S. PATENT DOCUMENTS

| 6,406,956 | B1 | 6/2002 | Tsai et al. | |
| 7,749,822 | B2 * | 7/2010 | Freeman et al. | 438/155 |
| 2002/0070403 | A1 * | 6/2002 | Hsu et al. | 257/302 |
| 2009/0090977 | A1 * | 4/2009 | Freeman et al. | 257/379 |
| 2010/0328022 | A1 * | 12/2010 | Fan et al. | 338/309 |
| 2011/0156161 | A1 * | 6/2011 | Tseng et al. | 257/379 |

* cited by examiner

*Primary Examiner* — James Harvey
(74) *Attorney, Agent, or Firm* — Winston Hsu; Scott Margo

(57) ABSTRACT

An integrated method includes fabricating a metal gate and a polysilicon resistor structure. A photoresistor layer is defined by an SAB photo mask and covers a part of a polysilicon structure of the polysilicon resistor. When the gate conductor of a poly gate transistor is etched, the part of the polysilicon structure is protected by the patterned photoresistor layer. After the polysilicon resistor and the metal gate are formed. The polysilicon resistor still has sufficient resistance and includes two metal structures for electrical connection.

7 Claims, 6 Drawing Sheets

METHOD FOR FABRICATING METAL GATE AND POLYSILICON RESISTOR AND RELATED POLYSILICON RESISTOR STRUCTURE

BACKGROUND OF THE INVENTION

1. Field of the Invention

The invention relates to a method for fabricating a metal gate and a polysilicon resistor and also relates to a polysilicon resistor structure.

2. Description of the Prior Art

In the field of semiconductor fabrication, the use of polysilicon material is diverse. Having a strong resistance to heat, polysilicon materials are commonly used to fabricate gate electrodes for metal-oxide semiconductor transistors. Devices fabricated by polysilicon still have many drawbacks, however. In contrast to most metal, polysilicon gates are fabricated by semiconductor materials having high resistance, which causes the polysilicon gate to work under a much lower rate than other metal gates. In order to compensate for this slightly lowered rate of performance, a significant amount of silicides is applied during the fabrication of polysilicon processes, such that the performance of the device can be increased to an acceptable level.

Furthermore, gate electrodes fabricated by polysilicon also result in a depletion effect. A depletion region at the interface between the gate and the gate dielectric layer will occur during operation. This depletion region not only thickens the gate dielectric layer, but also lowers the capacitance of the gate, and ultimately reduces the driving ability of the device. In order to solve this problem, metal gates are used to replace conventional polysilicon to fabricate gate electrodes for MOS transistors.

The conventional technique for fabricating a metal gate transistor includes firstly forming a dummy gate electrode by polysilicon. Then, after the MOS transistor is completed, the dummy gate electrode will be removed by an etching process. Later, a metal layer is deposited in the region where the dummy gate electrode was originally located.

In the semiconductor field, polysilicon is often used to form resistors. In order to integrate the fabricating process, the high resistance structure of the polysilicon resistor is formed together with the polysilicon gate of the transistor. Currently, in order to form metal gates, the polysilicon on the polysilicon gate serving as a dummy gate electrode is removed. The polysilicon of the high resistance structure on the polysilicon resistor will also be removed along with the dummy gate electrode. Later, a metal layer is filled into the region where the dummy gate electrode was originally located and the region where the polysilicon of high resistance structure was originally located. The metal layer that filling the region where the polysilicon of the high resistance structure was originally located will deteriorate the performance of the polysilicon resistor.

Therefore, an integrated method for fabricating the metal gate and the polysilicon resistor is needed to overcome the above-mentioned drawbacks.

SUMMARY OF THE INVENTION

The present invention provides an integrated method to fabricate a metal gate and a polysilicon resistor. The high resistance structure of the polysilicon resistor is protected during the fabrication of the metal gate transistor. The resistance of the polysilicon resistor is maintained at a sufficient value.

According to a preferred embodiment of the present invention, a method for fabricating metal gate and polysilicon resistor is provided. The method comprises: providing a substrate having a transistor region and a resistor region; forming a first gate dielectric layer and a first gate polysilicon layer on the transistor region from bottom to top, and forming a second gate dielectric layer and a second gate polysilicon layer on the resistor region from bottom to top; forming an inter-dielectric layer on the transistor and the high resistance structure; performing a planarizing process to remove part of the inter-dielectric dielectric layer to expose the first gate polysilicon layer and the second gate polysilicon layer; removing the first gate polysilicon layer and a part of the second gate polysilicon layer to form a first opening at the transistor region and at least one second opening at the resistor region, respectively; and forming a metal layer filling up the first opening and the second opening to form a metal gate at the transistor region and a resistor at the resistor region respectively.

According to another preferred embodiment of the present invention, a polysilicon resistor positioned on a substrate is provided. The polysilicon resistor comprises a dielectric layer on the substrate, a polysilicon structure positioned on the dielectric layer and two low resistance structures positioned on the dielectric layer and directly contacting two sidewalls of the polysilicon structure, respectively.

The present invention feature is that a salicide block (SAB) photo mask is used to define a photoresistor layer to cover the second gate polysilicon layer so that the second gate polysilicon layer is protected during the process of removing the first gate polysilicon layer. Therefore, in the end, the resistance of the polysilicon resistor is maintained at a sufficient value.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be detailed in the following. The preferred embodiments of the present invention are illustrated in the accompanying drawings with numbered elements. Like numbered numerals designate similar or the same parts, regions or elements. It is to be understood that the drawings are not drawn to scale and are only for illustration purposes.

Figure 1:
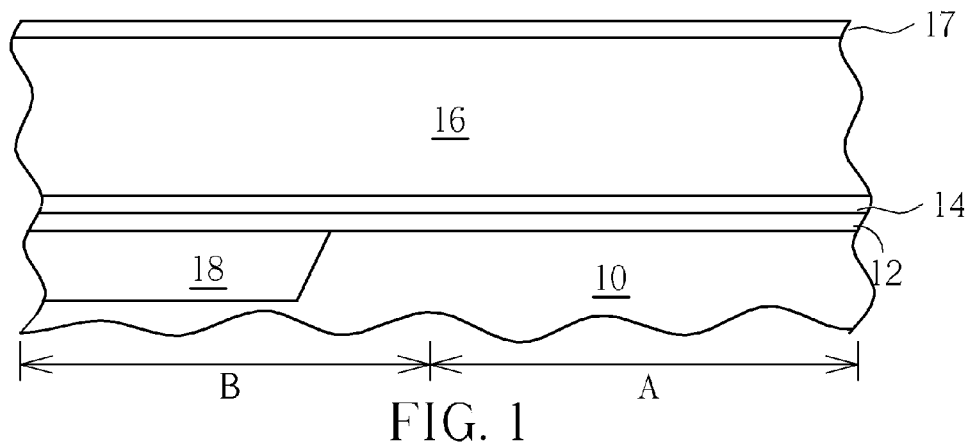
FIGS. 1 to 8 are schematic diagrams of a fabricating method for a metal gate and a polysilicon resistor according to the first preferred embodiment of the present invention.

FIGS. 1 to 8 are schematic diagrams of a fabricating method for a metal gate and a polysilicon resistor according to the first preferred embodiment of the present invention. As shown in FIG. 1, a substrate 10 having a transistor region A and a resistor region B is provided. Next, a dielectric layer 12, a work function metal layer 14, a polysilicon layer 16 and a hard mask layer 17 are formed to cover the transistor region A and the resistor region B from bottom to top. The work function metal layer 14 is composed of TiN, TaC, TaN, TaSiN, Al, W, WN, Pt, Ni, Ru, TaCN, TaCNO, or any combination thereof. In addition, a shallow trench isolation (STI) structure 18 is disposed in the resistor region B.

Figure 2:
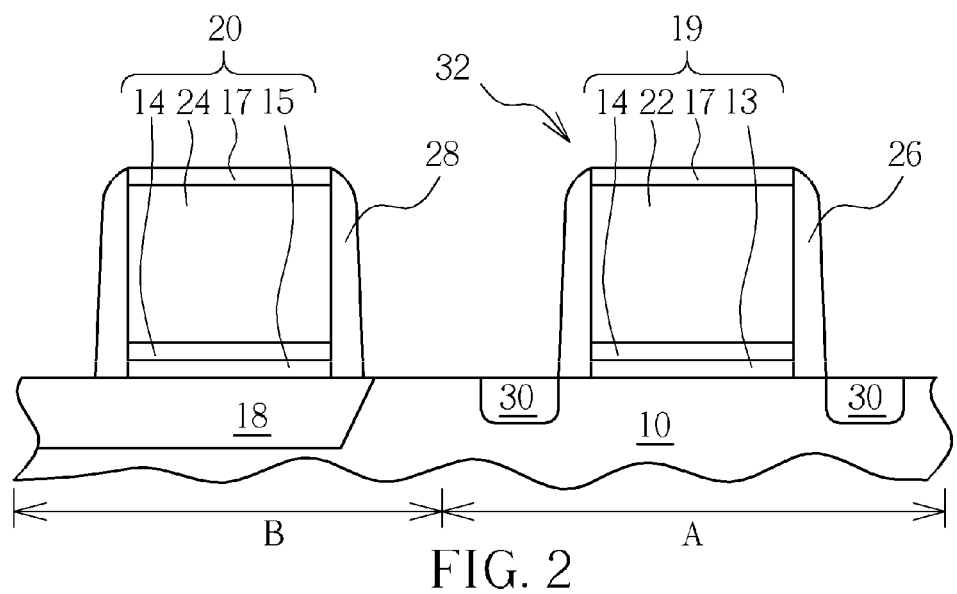

Then, as shown in FIG. 2, the hard mask layer 17 is patterned to serve as a mask of the dielectric layer 12, the work function metal layer 14 and the polysilicon layer 16. After that, the dielectric layer 12, the work function metal layer 14 and the polysilicon layer 16 are patterned to form a gate structure 19 on the transistor region A and a resistor structure 20 on the resistor region B. The patterned polysilicon layer 16 in the transistor region A forms a first gate polysilicon layer 22 and the patterned polysilicon layer 16 in the resistor region B forms a second gate polysilicon layer 24. The patterned dielectric layer 12 in the transistor region A forms a first gate dielectric layer 13, and the patterned dielectric layer 12 in the resistor region B forms a second gate dielectric layer 15. The gate structure 19 is composed of the first gate dielectric layer 13, the work function metal layer 14, the hard mask layer 17, and the first gate polysilicon layer 22. The resistor structure 20 is composed of the second gate dielectric layer 15, the work function metal layer 14, the hard mask layer 17, and the second gate polysilicon layer 24. Later, a first spacer 26 and a second spacer 28 are formed on the sidewalls of the gate structure 19 and the resistor structure 20, respectively. Subsequently, a source/drain region 30 is formed in the substrate 10 at two sides of the gate structure 19. At this point, the gate structure 19, the first spacer 26 and the source/drain region 30 form a poly gate transistor 32.

Figure 3:
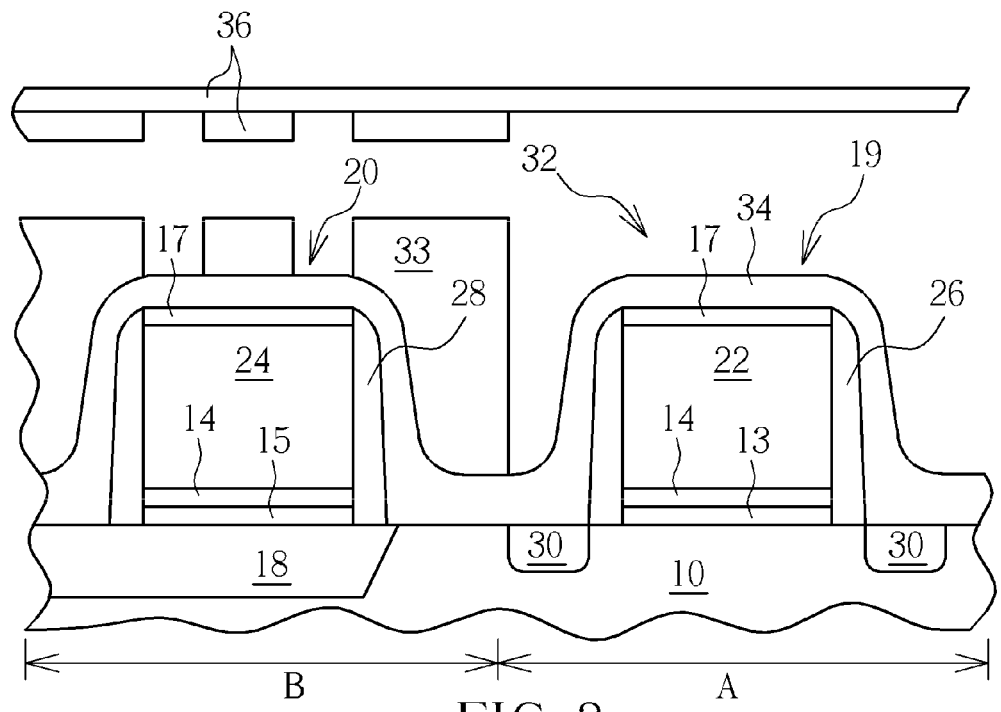
Figure 4:
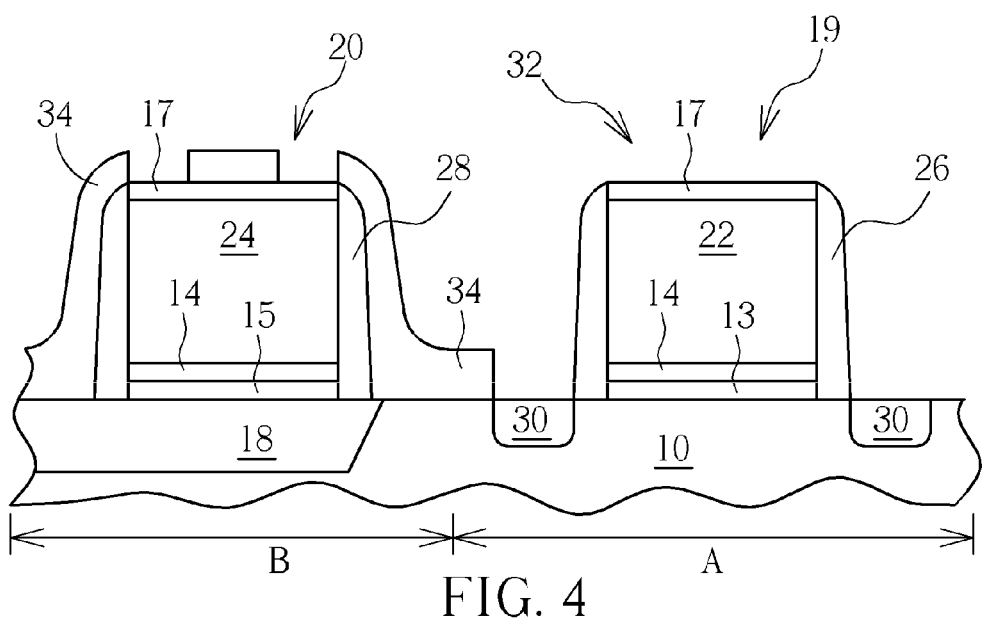

As shown in FIG. 3, a self-aligned silicide process is performed. First, a salicide block (SAB) mask layer 34 is formed on the gate structure 19, the transistor 32 and the substrate 10. Then, a photoresistor layer 33 on the SAB mask layer 34 is defined by a salicide block (SAB) photo mask 36. After that, the pattern on the photoresistor layer 33 is transferred onto the SAB mask layer 34 and the source/drain region 30 is exposed through the SAB mask layer 34.

Figure 5:
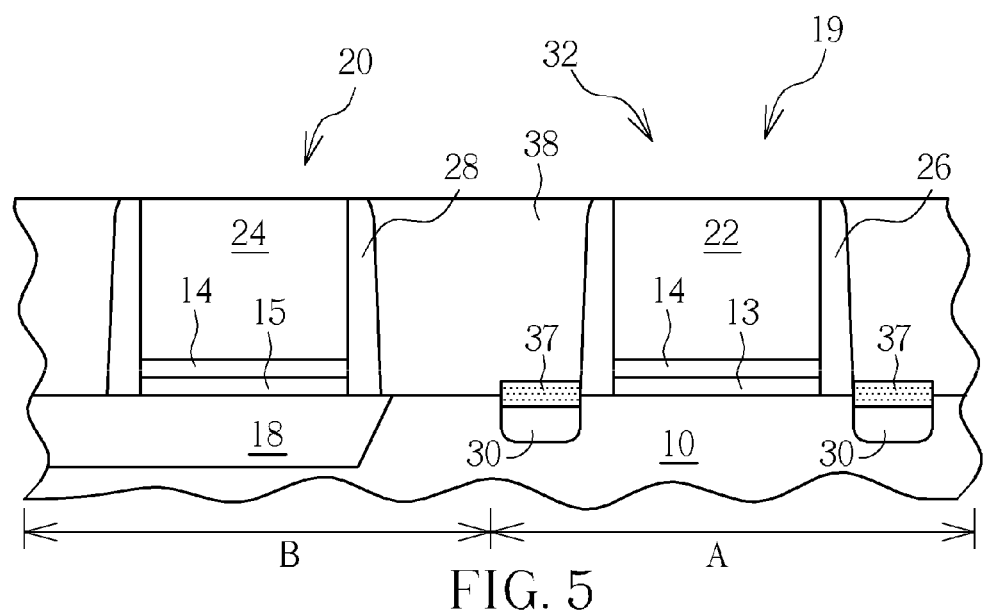

As shown in FIG. 5, a silicide structure 37 is formed at the source/drain region 30. Next, the SAB mask layer 34 is removed. Then, an inter-dielectric layer 38 is formed to cover the poly gate transistor 32 and the resistor structure 20 and the substrate 10. Subsequently, a planarizing process is performed to remove part of the inter-dielectric dielectric layer 38 to expose the first gate polysilicon layer 22 of the gate structure 19 and the second gate polysilicon layer 24 of the resistor structure 20.

Figure 6:
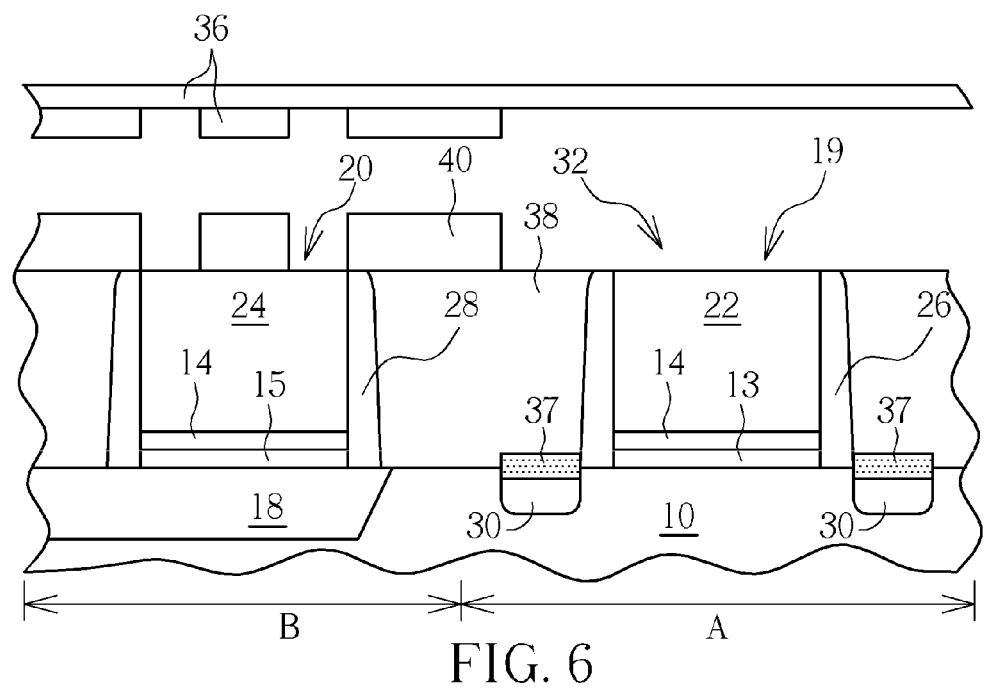

As shown in FIG. 6, a patterned photoresistor layer 40 is formed to cover a part of the second gate polysilicon layer 24 and expose the first gate polysilicon layer 22. More specifically, the patterned photoresistor layer 40 covers the middle part of the second gate polysilicon layer 24 and exposes the polysilicon layer at two ends of the second gate polysilicon layer 24 and the entire first gate polysilicon layer 22. It is noteworthy that the patterned photoresistor layer 40 can be formed by utilizing the SAB photo mask 36 which is also used in the aforesaid self-aligned silicide process for saliciding the source/drain region 30 as shown in FIG. 3.

Figure 7:
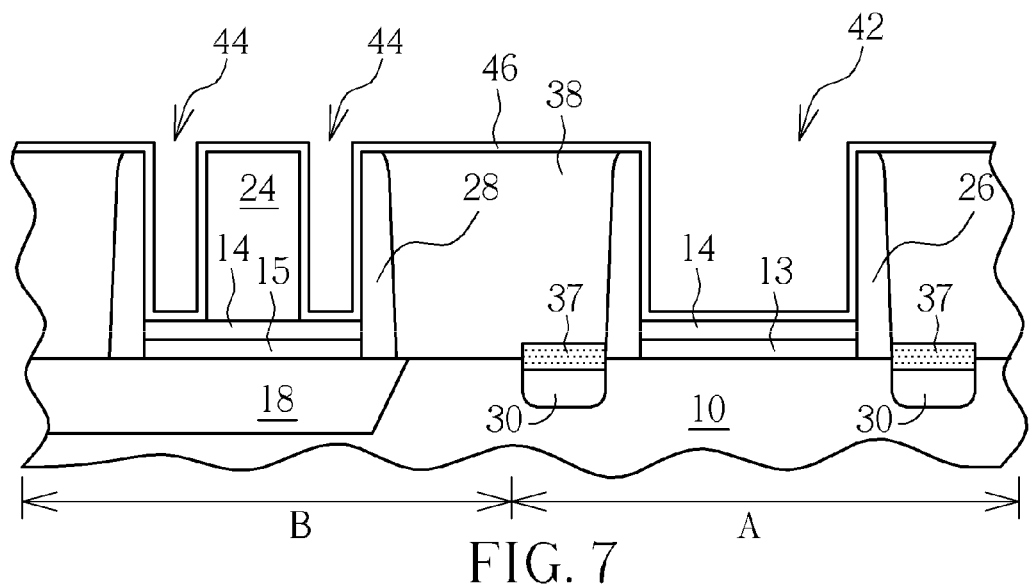

As shown in FIG. 7, two ends of the second gate polysilicon layer 24 and the first gate polysilicon layer 22 is removed by an etching process, such as a wet etching process. After that, a first opening 42 is formed in the position where the first gate polysilicon layer 22 was originally located. A second opening 44 is formed at the region where two ends of the second gate polysilicon layer 24 was originally located. Next, the patterned photoresistor layer 40 is removed. Later, a barrier layer 46 is deposited on the surface of the remaining second gate polysilicon layer 24, the surface of the work function metal layer 14, the sidewall of the first spacer 26, the sidewall of the second spacer 28 and the surface of the inter-dielectric layer 38. The barrier layer 46 can be composed of TiN, TaC, TaN, TaSiN, Al, W, WN, Pt, Ni, Ru, TaCN, TaCNO or any combination thereof. Preferably, the barrier layer 46 is made of the same material as the work function metal layer 14. According to another preferred embodiment, the barrier layer 46 can be formed optionally. That is, the steps of forming the barrier layer 46 can be omitted. In addition, the location of the second opening 44 is not limited to be at two ends of the second gate polysilicon layer 24. As long as the second opening 44 is at the second gate polysilicon layer 24 the spirit of the present invention is reached.

Figure 8:
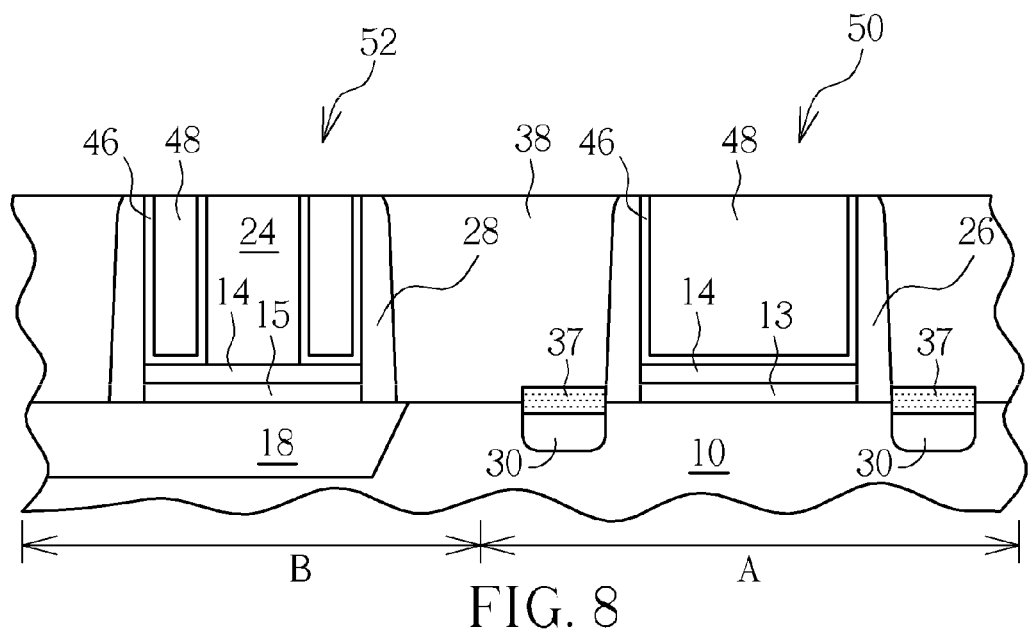

As shown in FIG. 8, a metal layer 48 is formed to fill up the first opening 42 and the second opening 44. The surface of the metal layer 48 is aligned with the surface of the inter-dielectric layer by a chemical mechanical polishing process. The metal layer 48 can be composed of Al, W, TiAl, cobalt tungsten phosphide (COWP) or any combination thereof. At this point, the metal gate transistor 50 of the present invention is completed. The metal layer 48 filling in the first opening replaces the first gate polysilicon layer 22. The metal gate transistor 50 also includes the first gate dielectric layer 13, the work function metal layer 14, the optional-formed barrier layer 46, the salicided source/drain region 30 and the first spacer 26.

At the point that the metal gate transistor 50 is completed, the polysilicon resistor 52 is also finished. The polysilicon resistor 52 includes the second gate dielectric layer 15, the work function metal layer 14, the remaining second gate polysilicon layer 24, the optional-formed barrier layer 46, the metal layer 48 filling in the second opening 44 and the second spacer 28. The metal layer 48 filling in the second opening 44 becomes an electrical connecting device for the polysilicon resistor 52. It is noted that the middle of the second gate polysilicon layer is protected by the patterned photoresistor layer when the first gate polysilicon layer is etched. Therefore, only two ends of the second gate polysilicon layer are replaced by the metal layer after the etching process and the metal deposition process. The middle of the second gate polysilicon layer is still polysilicon. In this way, the drawback of the conventional process (removing the entire second gate polysilicon layer simultaneously with the first gate polysilicon layer) can be prevented. Moreover, the patterned photoresistor layer is formed by utilizing the SAB photo mask. Therefore, no extra photo mask is needed.

Moreover, according to the second preferred embodiment of the present invention, after the formation of the work function metal layer 14 in FIG. 1, a patterned photoresistor layer can be used to cover the transistor region A and expose the resistor region B. Later, the work function metal layer 14 on the resistor region B can be removed by the etching process. Then the patterned photoresistor layer is removed. Next, the polysilicon layer 16 can be formed on transistor region A and the resistor region B on the substrate to form a structure shown in FIG. 9.

Figure 9:
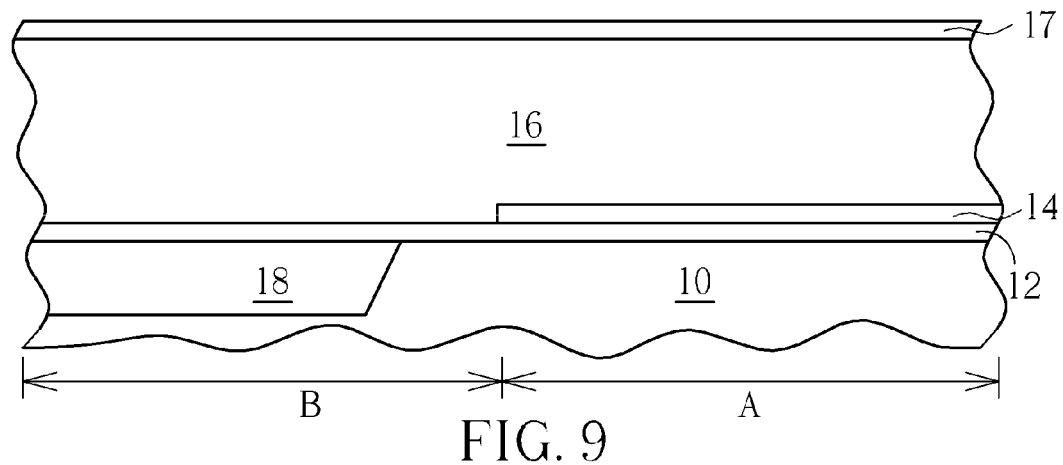
FIGS. 9 to 10 are schematic diagrams of a fabricating method for a metal gate and a polysilicon resistor according to the second preferred embodiment of the present invention.
Figure 10:
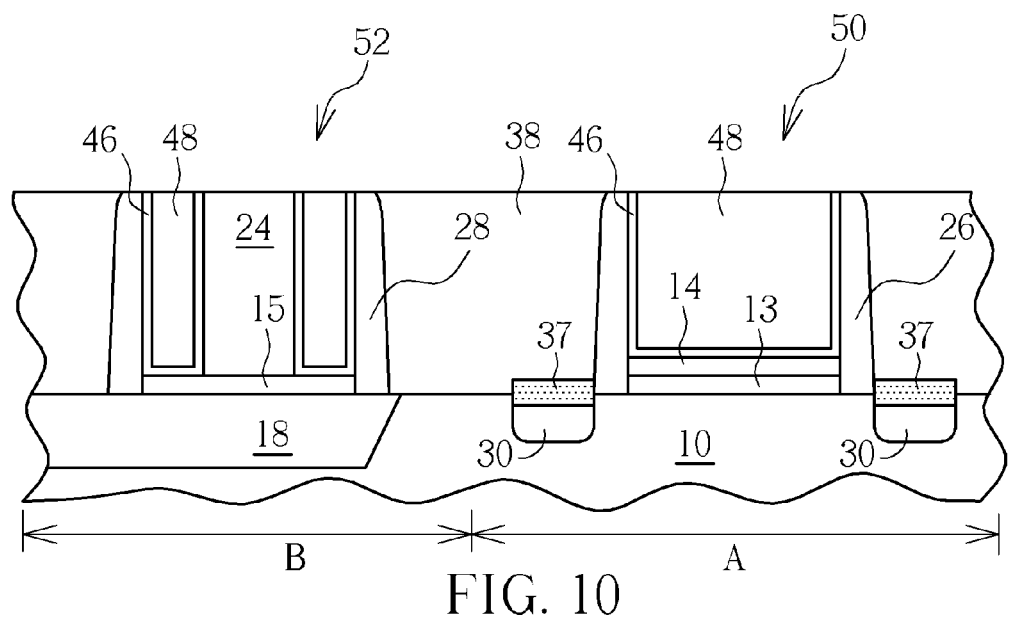

In the second preferred embodiment, after completing the step depicted in FIG. 9, the following fabricating steps are the same as the steps illustrated in FIGS. 2 to 8. As a result, as shown in FIG. 10, a metal gate transistor 50 and a polysilicon resistor 52 are formed after performing the step in FIG. 9 and the steps in FIGS. 2 to 8. The difference between FIG. 8 and FIG. 10 is that the polysilicon resistor 52 in FIG. 10 does not have the work function metal layer. Since other elements are fabricated by the same steps, the resistance of the polysilicon resistor 52 in FIG. 10 may be larger than that of the polysilicon resistor 52 in FIG. 8. Because the polysilicon resistor 52 in FIG. 8 has the work function metal layer 14 disposed under the second gate polysilicon layer 24, the total resistance of the polysilicon resistor 52 in FIG. 8 is decreased. However, the fabricating process of the polysilicon resistor 52 in FIG. 8 is easier than that of the polysilicon resistor 52 in FIG. 10, because the work function metal layer 14 in FIG. 8 does not need to be removed by extra steps.

After the metal gate transistor 50 and the polysilicon resistor 52 are completed, the inter circuit connection can be formed. For example, a plurality of contact plugs can be formed in the inter-dielectric layer 38 above the source/drain region 30. Alternatively, another dielectric layer can be formed on the inter-dielectric layer 38. Then, the contact plugs can be formed in the dielectric layer to connect the polysilicon resistor, the metal gate and the source/drain region with other elements.

Figure 11:
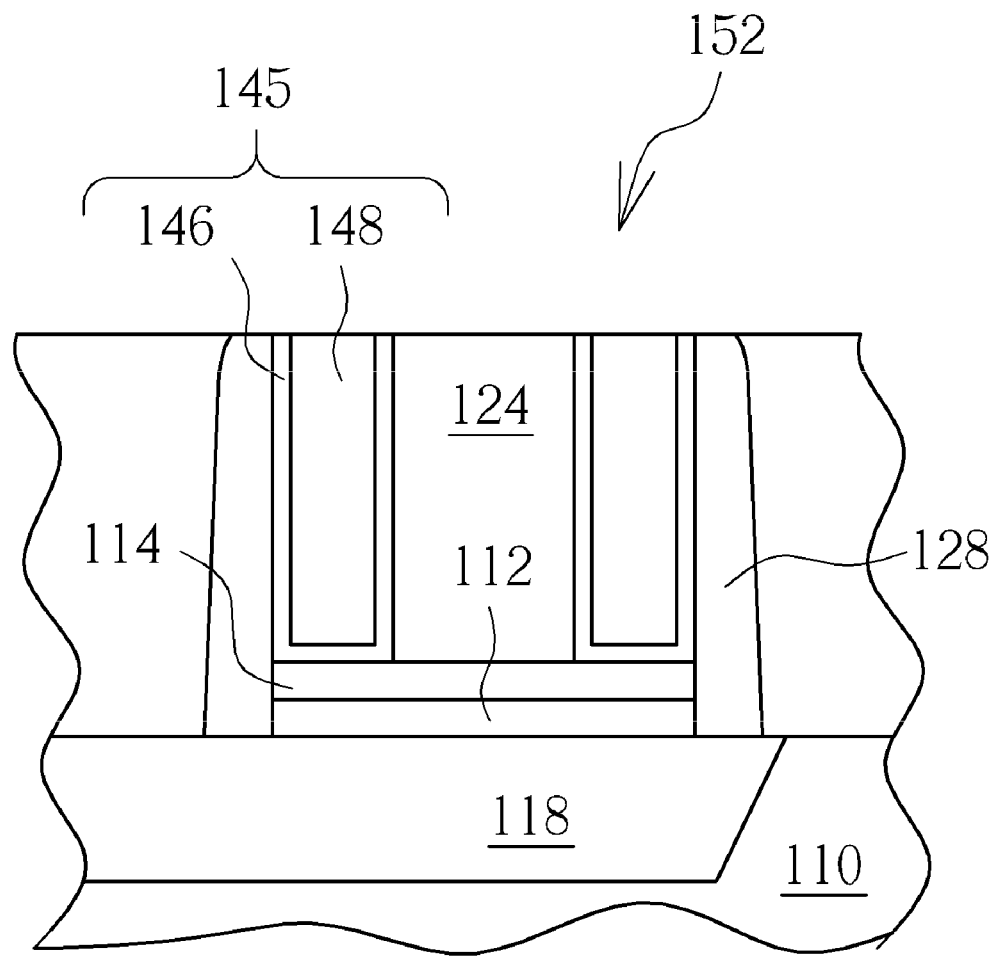
FIG. 11 is a schematic diagram illustrating the side-view of the polysilicon resistor according to a preferred embodiment of the present invention.

A polysilicon resistor is also provided in the present invention. FIG. 11 is a schematic diagram illustrating the side-view of the polysilicon resistor according to a preferred embodiment of the present invention.

As shown in FIG. 11, a polysilicon resistor 152 includes a dielectric layer 112 covering a substrate 110, a polysilicon structure 124 positioned on the dielectric layer 112, two low resistance structures 145 positioned on the dielectric layer 112 and directly contacting two sidewalls of the polysilicon structure 124, respectively, and a work function metal layer 114 optionally positioned between the low resistance structures 145 and the dielectric layer 112 and between the polysilicon structure 124 and the dielectric layer 112. The substrate 110 can includes a shallow trench isolation structure 118. The polysilicon resistor 152 can also include a spacer 128 disposed at the sidewall of each of the low resistance structures 145. Furthermore, the work function metal layer 114 can be disposed optionally. That is, the polysilicon resistor 152 may have the work function metal layer 114 disposed between the polysilicon structure 124 and the dielectric layer 112 and between the low resistance structures 145 and the dielectric layer 112 or not. FIG. 11 takes the embodiment of the polysilicon resistor 152 has the work function metal layer 114 as an example.

Each of the low resistance structures 145 has a metal structure 148. Preferably, each of the low resistance structures 145 has a barrier layer 146 partly surrounding the metal structure 148. Moreover, the barrier layer 146 is disposed between the metal structure 148 and the work function metal layer 114, the metal structure 148 and the polysilicon structure 124, and the spacer 128 and the metal structure 148. The metal structure 148 can be composed of Al, W, TiAl, cobalt tungsten phosphide (COWP) or any combination thereof. The barrier layer 146 can be composed of TiN, TaC, TaN, TaSiN, Al, W, WN, Pt, Ni, Ru, TaCN, TaCNO or any combination thereof. The work function metal layer 114 is composed of TiN, TaC, TaN, TaSiN, Al, W, WN, Pt, Ni, Ru, TaCN, TaCNO, or any combination thereof. Preferably, the barrier layer 146 and the work function metal layer 114 comprise identical material; however, based on different designs, the material of the barrier layer 146 and the work function metal layer 114 can be different.

The feature of the polysilicon resistor 152 of the present invention is that each low resistance structure 145 contacts with the corresponding side of the polysilicon structure 124. The low resistance structures 145 can serve as the electrical connecting device of the polysilicon structure 124. In addition, the polysilicon resistor 152 without the work function metal layer 114 will have higher total resistance than that of the polysilicon resistor 152 having the work function metal layer 114.

Those skilled in the art will readily observe that numerous modifications and alterations of the device and method may be made while retaining the teachings of the invention.

What is claimed is:

1. A polysilicon resistor positioned on a substrate, the polysilicon resistor comprising:
   a dielectric layer on or above the substrate;
   a polysilicon structure positioned on or above the dielectric layer;
   two low resistance structures positioned on or above the dielectric layer and directly contacting two sidewalls of the polysilicon structure, respectively;
   each of the low resistance structures comprises a metal structure; and
   each of the low resistance structures comprises a barrier layer surrounding a part of the metal structure.

2. The polysilicon resistor of claim 1, wherein the polysilicon resistor further comprises a spacer positioned on the sidewalls of the low resistance structures.

3. The polysilicon resistor of claim 1, wherein the metal structure comprises Al, W, TiAl, or cobalt tungsten phosphide (CoWP).

4. The polysilicon resistor of claim 1, wherein the barrier layer comprises TiN, TaC, TaN, TaSiN, Al, W, WN, Pt, Ni, Ru, TaCN, or TaCNO.

5. The polysilicon resistor of claim 1, wherein the polysilicon resistor further comprises a work function metal layer positioned between the dielectric layer and the low resistance structures and between the polysilicon structure and the dielectric layer.

6. The polysilicon resistor of claim 5, wherein the work function metal layer comprises TiN, TaC, TaN, TaSiN, Al, W, WN, Pt, Ni, Ru, TaCN, or TaCNO.

7. The polysilicon resistor of claim 1, wherein the substrate comprises a shallow trench isolation structure.

* * * * *